United States Patent
Aoki et al.

(10) Patent No.: US 9,159,905 B2
(45) Date of Patent: Oct. 13, 2015

(54) ELECTRONIC DEVICE, ELECTRONIC APPARATUS, MOBILE UNIT, AND METHOD OF MANUFACTURING ELECTRONIC DEVICE

(71) Applicant: Seiko Epson Corporation, Tokyo (JP)

(72) Inventors: Shinya Aoki, Minowa (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 153 days.

(21) Appl. No.: 13/910,495

(22) Filed: Jun. 5, 2013

(65) Prior Publication Data

US 2013/0328444 A1 Dec. 12, 2013

(30) Foreign Application Priority Data

Jun. 8, 2012 (JP) .................................. 2012-130480

(51) Int. Cl.
- H01L 41/053 (2006.01)
- H03H 9/10 (2006.01)
- H03H 9/15 (2006.01)
- H01L 41/332 (2013.01)
- G01C 19/5628 (2012.01)

(52) U.S. Cl.
CPC .......... H01L 41/332 (2013.01); G01C 19/5628 (2013.01); *Y10T 29/49155* (2015.01)

(58) Field of Classification Search
CPC ....... H03H 9/0095; H03H 9/09; H03H 9/215; H03H 9/545; H03H 3/0077; G04F 5/063
USPC ............................ 310/312, 344, 370; 333/188
See application file for complete search history.

(56) References Cited

U.S. PATENT DOCUMENTS

| | | | |
|---|---|---|---|
| 3,969,640 A * | 7/1976 | Staudte .......................... | 310/312 |
| 4,035,673 A * | 7/1977 | Ishida et al. .................. | 310/344 |
| 7,245,057 B2 * | 7/2007 | Ma et al. ....................... | 310/312 |
| 7,400,078 B2 | 7/2008 | Takahashi et al. | |
| 7,536,768 B2 * | 5/2009 | Kawashima .................... | 29/593 |
| 7,723,905 B2 | 5/2010 | Takahashi et al. | |
| 7,984,536 B2 * | 7/2011 | Takahashi ..................... | 29/25.35 |
| 8,053,952 B2 | 11/2011 | Takahashi | |
| 8,400,050 B2 * | 3/2013 | Onitsuka et al. .............. | 310/370 |
| 8,410,868 B2 * | 4/2013 | Schoepf et al. ............... | 333/186 |
| 2007/0182291 A1 * | 8/2007 | Isobe et al. .................... | 310/370 |
| 2008/0284280 A1 * | 11/2008 | Ohshima et al. .............. | 310/312 |
| 2011/0210408 A1 | 9/2011 | Otsuki | |
| 2012/0126664 A1 * | 5/2012 | Ogura et al. .................. | 310/312 |
| 2013/0074597 A1 * | 3/2013 | Ichikawa .................... | 73/504.15 |
| 2013/0081473 A1 * | 4/2013 | Ichikawa ........................ | 73/658 |
| 2013/0255387 A1 | 10/2013 | Hanaoka | |
| 2013/0285508 A1 * | 10/2013 | Nakagawa ............... | 310/323.21 |

FOREIGN PATENT DOCUMENTS

| | | |
|---|---|---|
| JP | 2010-048688 A | 3/2010 |
| JP | 2010-118784 A | 5/2010 |
| JP | 2010-230691 A | 10/2010 |
| JP | 2011-151853 A | 8/2011 |
| JP | 2011-179941 A | 9/2011 |
| JP | 2013-207663 A | 10/2013 |

* cited by examiner

*Primary Examiner* — Thomas Dougherty
(74) *Attorney, Agent, or Firm* — Harness, Dickey & Pierce, P.L.C.

(57) ABSTRACT

A vibrating element as an element on which a base part, a supporting part extending from the base part, and adjustment electrodes as mass adjustment parts are provided and a semiconductor substrate as a circuit element are provided, and the adjustment electrodes are placed in locations not overlapping with the semiconductor substrate in a plan view, the supporting part and the semiconductor substrate are connected, and thereby, the vibrating element is mounted on the semiconductor substrate.

13 Claims, 6 Drawing Sheets

ELECTRONIC DEVICE, ELECTRONIC APPARATUS, MOBILE UNIT, AND METHOD OF MANUFACTURING ELECTRONIC DEVICE

BACKGROUND

1. Technical Field

The present invention relates to an electronic device, an electronic apparatus and a mobile unit using the device, and a method of manufacturing the electronic device.

2. Related Art

In related art, as an example of an electronic device, a vibrating device that senses acceleration, an angular velocity, or the like has been known. The vibrating device includes a vibrating element as a sensor element as an example of an element and a circuit element having a function of driving the vibrating element.

Further, as the vibrating device, a sensor device including a gyro vibrating reed (also referred to as "gyro element") as a vibrating element and a semiconductor substrate (circuit element) provided with a circuit element housed in a package is disclosed in JP-A-2011-179941.

In the vibrating device having the configuration, the vibrating element is mounted to be superimposed on the semiconductor substrate. Further, in adjustment of the vibration frequency of the vibrating element, a laser beam is used for removing at least a part of a mass adjustment part (an electrode or the like) provided on the vibrating element.

However, in the above described vibrating device, the laser beam used for adjustment of the vibration frequency of the vibrating element can be transmitted through the vibrating element and applied to the semiconductor substrate (circuit element). In the case where the laser beam transmitted through the vibrating element is applied to the semiconductor substrate, the laser beam can damage the semiconductor substrate (circuit element).

SUMMARY

An advantage of some aspects of the invention is to solve at least a part of the problems described above, and the invention can be implemented as the following forms or application examples.

Application Example 1

This application example is directed to an electronic device including an element on which a mass adjustment part is provided, and a circuit element on which the element is mounted, wherein the element is provided in a location such that the mass adjustment part may not overlap with the circuit element in a plan view.

According to the electronic device of this application example, the mass adjustment part is placed in the location not overlapping with the circuit element in the plan view. Therefore, for example, even when the laser beam applied to the mass adjustment part is transmitted through the element, the beam is not applied to the circuit element. Thereby, the damage on the circuit element by the laser beam may be prevented.

Application Example 2

This application example is directed to the electronic device according to the application example described above, wherein the mass adjustment part has a metal layer and at least a part of the metal layer is removed.

According to the electronic device of this application example, the damage on the circuit element by the laser beam may be prevented, and the adjustment of the mass may be performed by removing at least a part of the metal layer of the mass adjustment part by application of the laser beam.

Application Example 3

This application is directed to the electronic device according to the application example described above, wherein the element includes a base part, a supporting part extending from the base part, a pair of detection vibrating arms extending from one end of the base part, a pair of drive vibrating arms extending from the other end opposite to the one end of the base part, and a pair of adjustment vibrating arms extending from one of the one end and the other end and provided to sandwich the detection vibrating arms or the drive vibrating arms, wherein the mass adjustment part is provided on the adjustment vibrating arm, and the supporting part and the circuit element are connected.

According to this electronic device of the application example, even when the laser beam applied to the mass adjustment part is transmitted through the element, the beam is not applied to the circuit element, and the damage on the circuit element by the laser beam may be prevented.

Application Example 4

This application example is directed to an electronic apparatus including the electronic device according to any one of the application examples described above.

According to this application example, the electronic device in which the damage on the circuit element is prevented is used, and a highly reliable electronic apparatus with stable characteristics may be provided.

Application Example 5

This application example is directed to the electronic device of the application example described above, wherein the circuit element is provided on a substrate, and a protective layer is provided on the substrate to overlap with the mass adjustment part in a plan view of the element.

According to this application example, even when the laser beam applied to the mass adjustment part is transmitted through the element, the beam is not directly applied to the substrate because of the protective layer, and the damage on the substrate by the laser beam may be prevented.

Application Example 6

This application example is directed to a mobile unit including the electronic device according to any one of the application examples described above.

According to this application example, the electronic device in which the damage on the circuit element is prevented is used, and a highly reliable mobile unit with stable characteristics may be provided.

Application Example 7

This application example is directed to a method of manufacturing an electronic device including preparing an element on which a base part, a supporting part extending from the base part, and a mass adjustment part are provided, preparing a circuit element on which the element is to be mounted, providing the element in a location such that the mass adjustment part may not overlap with the circuit element in a plan view and mounting the element on the circuit element, and performing mass adjustment by applying a laser beam to the mass adjustment part.

According to the method of manufacturing the electronic device of this application example, the mass adjustment part is placed in the location not overlapping with the circuit element in the plan view and the element is mounted on the circuit element. Then, when the mass adjustment is performed by applying the laser beam to the mass adjustment part of the element, even if the laser beam that has been applied to the mass adjustment part is transmitted through the element, the beam is not applied to the circuit element because the mass adjustment part is placed in the location not overlapping with the circuit element in the plan view. As described above, the method of manufacturing the electronic device that may prevent the damage on the circuit element by the laser beam may be provided.

BRIEF DESCRIPTION OF THE DRAWINGS

The invention will be described with reference to the accompanying drawings, wherein like numbers reference like elements.

FIG. 1A is a plan view and FIG. 1B is a front sectional view.

DESCRIPTION OF EXEMPLARY EMBODIMENTS

As below, an embodiment of the invention will be explained with reference to the drawings. Note that, in the following respective drawings, the respective component elements may be shown in appropriate dimensions and ratios different from those of the actual component elements for recognition on the drawings. Further, XYZ orthogonal coordinate systems are set and the location relationships among the respective parts will be explained with reference to the XYZ orthogonal coordinate systems. A predetermined direction within a vertical plane is referred to as the X-axis direction, a direction orthogonal to the X-axis direction within the vertical plane is referred to as the Y-axis direction, and a direction orthogonal to both the X-axis direction and the Y-axis direction is referred to as the Z-axis direction. Furthermore, with reference to the direction of gravitational force, the direction of gravitational force is referred to as the downward direction and the opposite direction is referred to as the upward direction.

A vibrating device of the embodiment as an example of an electronic device according to the invention is provided with a vibrating element superimposed on a first surface as an active face of a semiconductor substrate on which a driver circuit element is provided.

The embodiment will be explained with reference to FIGS. 1A, 1B, 2, and 3 using the vibrating device as the example of the electronic device according to the invention.

Figure 1A:
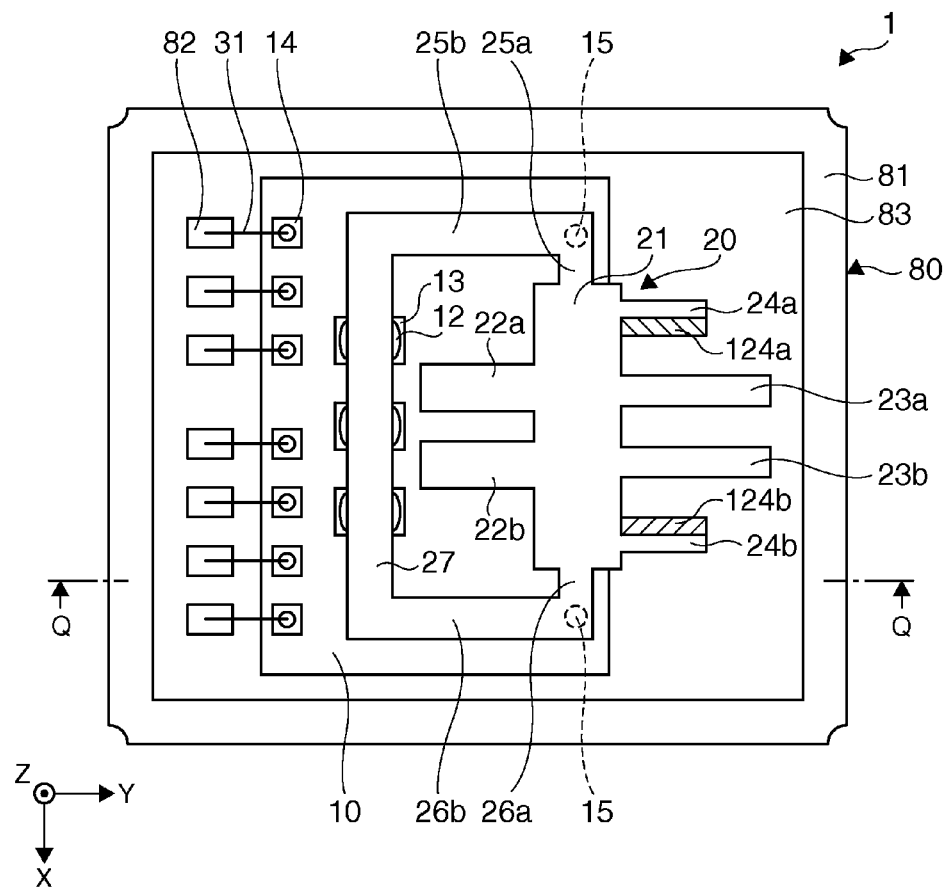
FIGS. 1A and 1B schematically show a vibrating device as an electronic device according to an embodiment.
Figure 1B:
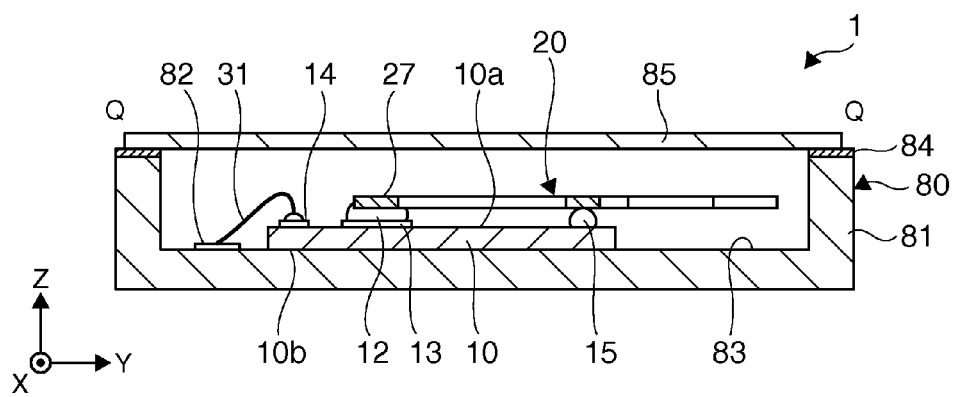
Figure 2:
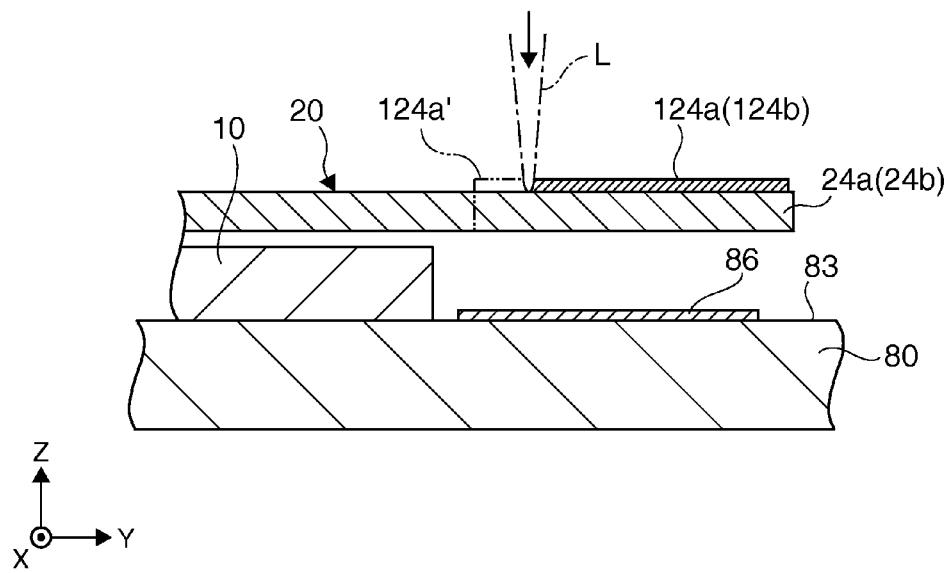
FIG. 2 is a partial sectional view of the vibrating device as the electronic device according to the embodiment in which a part including a mass adjustment part is enlarged.
Figure 3:
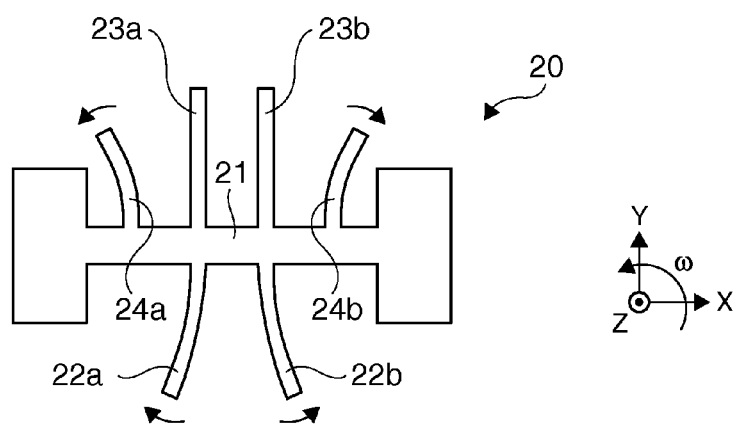
FIG. 3 is a diagram for explanation of a movement of a vibrating element (gyro element) as an element according to the embodiment.

FIGS. 1A and 1B schematically show an overall configuration of a vibrating device according to the embodiment, and FIG. 1A is a plan view and FIG. 1B is a front sectional view. FIG. 2 is a partial sectional view of the vibrating device in which a part including a mass adjustment part is enlarged. FIG. 3 is a diagram for explanation of a movement of a vibrating element (gyro element) as an element used for the vibrating device.

As shown in FIGS. 1A and 1B, a vibrating device 1 as the example of the electronic device of the embodiment includes a semiconductor substrate 10 as a circuit element, a vibrating element (gyro element) 20 as an element, and a base substrate (package) 80.

Structure of Vibrating Element

For the vibrating element (gyro element) 20 of the embodiment, quartz as a piezoelectric material is used as a base material (a material forming a main part). The quartz has as a crystal axes an X-axis called an electric axis, a Y-axis called a mechanical axis, and a Z-axis called an optical axis. In the embodiment, an example using the so-called quartz Z-plate having a predetermined thickness in the Z-axis direction orthogonal to a plane defined by the X-axis and the Y-axis orthogonal to each other in the crystal axes of the quartz, which is cut out along the plane and processed in a flat plate, as a base material will be explained. Note that the predetermined thickness here is appropriately set according to an oscillation frequency (resonance frequency), the outer size, workability, or the like. Further, the flat plate forming the vibrating element 20 may accept errors of cutout angles from quartz with respect to each of the X-axis, Y-axis, and the Z-axis in a certain range. For example, the plate rotated in a range from zero to two degrees around the X-axis and cut out may be used. The same applies to the Y-axis and the Z-axis. In the embodiment, the vibrating element 20 uses quartz, and may use another piezoelectric material (for example, lithium tantalum, lead zirconate titanate, or the like) as the base material.

The vibrating element 20 is formed by etching (wet etching or dry etching) using a photolithography technology. Note that a plurality of the vibrating elements 20 may be cut out from one quartz wafer.

The vibrating element 20 of the embodiment is a gyro element having the so-called H-shaped configuration. The vibrating element 20 has a base part 21, drive vibrating arms 22a, 22b and detection vibrating arms 23a, 23b as vibrating parts, and adjustment vibrating arms 24a, 24b integrally formed by processing of the base material. Further, a first connecting part 25a extending from one end of the base part 21 and a first extending part 25b extending from the first connecting part 25a, and a second connecting part 26a extending from the other end of the base part 21 and a second extending part 26b extending from the second connecting part 26a are formed. Furthermore, the first extending part 25b and the second extending part 26b respectively extend and are connected to form a supporting part 27. The supporting part 27 is provided to face the drive vibrating arms 22a, 22b, and an electrode (not shown) for fixing the vibrating element 20 to the semiconductor substrate 10 is provided thereon. Accordingly, the vibrating element 20 is mounted on the semiconductor substrate 10 with electric continuity by fixation of the electrode provided on the supporting part 27 to the semiconductor substrate 10.

Adjustment electrodes (metal layers) 124a, 124b as mass adjustment parts are formed on the adjustment vibrating arms 24a, 24b of the vibrating element 20. Further, the adjustment electrodes 124a, 124b are used for frequency adjustment of the vibrating element 20. The frequency adjustment to a desired frequency is performed by removing parts of the adjustment electrodes 124a, 124b to change (reduce) the masses and change (raise) the frequencies of the adjustment vibrating arms 24a, 24b by a method of applying a laser beam to the adjustment vibrating arms 24a, 24b (the details will be described later).

Detection electrodes (not shown) are formed on the detection vibrating arms 23a, 23b of the vibrating element 20. Further, drive electrodes (not shown) are formed on the drive vibrating arms 22a, 22b. The vibrating element 20 forms a detection vibration system that detects an angular velocity or the like with the detection vibrating arms 23a, 23b, and forms a drive vibration system that drives the vibrating element 20 with the drive vibrating arms 22a, 22b and the adjustment vibrating arms 24a, 24b.

Structure of Semiconductor Substrate

The semiconductor substrate 10 has an active area in which a semiconductor element such as a transistor or a memory element (not shown) and an active element (not shown) such as an integrated circuit (driver circuit) formed to include circuit wiring on an active face 10a of the semiconductor substrate 10.

In the active element formed in the active area, a driver circuit for driving to vibrate the vibrating element 20, a detector circuit that detects detection vibration produced in the vibrating element 20 when an angular velocity or the like is applied, etc. are provided.

Further, a stress relaxation layer (not shown in FIGS. 1A, 1B, and 2) that relaxes stress generated between the semiconductor substrate 10 and the vibrating element 20 due to thermal expansion (contraction) is provided on the active face 10a.

Electrode Configuration of Semiconductor

First electrodes 13 disposed on the active face 10a side are provided on the semiconductor substrate 10. The first electrodes 13 are formed to directly conduct to the integrated circuit provided on the semiconductor substrate 10. Further, on the active face 10a, a first insulating film as a passivation film is formed (not shown), and an opening part (not shown) is formed on the first electrodes 13 in the first insulating film. Furthermore, an opening part (not shown) is formed on the first electrodes 13 also in an opening part (not shown) of the stress relaxation layer. According to the configuration, the first electrodes 13 are exposed to the outside within the respective opening parts.

A connecting terminal 12 is provided on the first electrode 13. The connecting terminal 12 is a projection electrode formed by Au stud bump, for example. Note that the connecting terminal 12 may be formed using another conducting material such as copper, aluminum, or solder ball than the Au stud bump. Further, the connecting terminal 12 may be formed using a conducting adhesive as mixture of a conducting filler such as silver powder or copper powder and a synthetic resin or the like.

According to the configuration, the semiconductor substrate 10 and the vibrating element 20 are electrically connected to the electrode (not shown) of the supporting part 27 provided on the vibrating element 20 via the first electrodes 13 and the connecting terminals 12 formed on the semiconductor substrate 10.

In this regard, in the vibrating element 20, a gap between the semiconductor substrate 10 and itself is provided because the connecting terminals 12 are the projection electrodes.

Further, element holding parts 15 having nearly the equal thickness to that of the connecting terminal 12 are provided at the active face 10a side of the semiconductor substrate 10 in locations facing the first connecting part 25a and the second connecting part 26a of the vibrating element 20. It is preferable that the element holding parts 15 are formed using a soft material including a polyimide resin, a silicone resin, a urethane resin, or the like, for example.

The element holding parts 15 may reliably keep the air gap between the semiconductor substrate 10 and the vibrating element 20 and function as the so-called buffer for preventing the vibrating element 20 from colliding with the semiconductor substrate 10 and breaking when the vibrating element 20 bends due to an impact on the vibrating device 1.

Note that, in the embodiment, the example in which the element holding parts 15 are formed has been explained, however, a configuration without the element holding parts 15 may be employed as long as a sufficient gap is provided between the vibrating element 20 and the semiconductor substrate 10.

Further, in the integrated circuit provided on the semiconductor substrate 10, other electrodes (not shown) than the first electrodes 13 and wiring connected to the electrodes are provided. The integrated circuit is connected to wiring terminals (pad electrodes) 14 via these electrodes or wiring. The wiring terminal 14 is formed in a pad shape for electrical or mechanical connection. The wiring terminal 14 is connected to a connecting part 82 provided on the base substrate 80 by the so-called wire bonding using a wire 31 of gold (Au), aluminum (Al), or the like, for example. Note that, in the example, the configuration using the wires 31 for connection of the wiring terminals 14 and the base substrate 80 (connecting parts 82) has been explained, however, they may be connected using flexible printed circuits (FPC) or the like in place of the wires 31.

Base Substrate (Package)

Next, the base substrate 80 forming the vibrating device 1 will be explained.

The semiconductor substrate 10 is bonded (connected) to a bottom surface 83 of the base substrate (package) 80. Regarding the bonding between the semiconductor substrate 10 and the bottom surface 83, a passive face 10b of the semiconductor substrate 10 opposed to the active face 10a of the semiconductor substrate 10 is bonded to the bottom surface 83 using a bonding member such as an adhesive (not shown).

The base substrate 80 is formed using an insulating material such as ceramic, for example. The connecting parts 82 are formed on the bottom surface 83 of the base substrate 80 to be bonded to the semiconductor substrate 10. The connecting parts 82 are metal-coated with gold (Au), silver (Ag), or the like. Further, the connecting parts 82 of the base substrate 80 and the wiring terminals 14 provided on the semiconductor substrate 10 are connected by the wires 31. Note that the connecting parts 82 are connected to external terminals provided on the base substrate 80 using wiring (not shown).

The base substrate 80 forms a package (container) having a surrounding side wall 81 and a recessed center part. The semiconductor substrate 10, the vibrating element 20, etc. housed within the base substrate 80 (within the package) are air-tightly sealed by a lid member 85. A metal lid is used for the lid member 85, and bonded to an end surface of the side wall 81 of the package via a seal ring 84.

Arrangement of Vibrating Element

The vibrating element 20 is provided at the active face 10a side of the semiconductor substrate 10 so that the adjustment electrodes 124a, 124b as the mass adjustment parts provided on the adjustment vibrating arms 24a, 24b may not overlap with the semiconductor substrate 10 in a plan view of the vibrating device 1. In other words, the vibrating element 20 is provided so that the adjustment electrodes 124a, 124b may face the bottom surface 83 of the base substrate 80 in the plan view of the vibrating device 1.

The vibrating element 20 is mounted on the semiconductor substrate 10 by connection of the supporting part 27 to the first electrodes 13 provided on the semiconductor substrate 10 via the connecting terminals 12.

As shown in FIG. 2, a laser beam L radiated from a direction of an arrow in the drawing removes the adjustment electrode (metal layer) 124a (124b) with the optical axis of the laser beam L shifting in the horizontal direction. In the part 124a' in which the adjustment electrode 124a (124b) has been removed, the laser beam L is transmitted through the adjustment vibrating arms 24a, 24b. Therefore, when the vibrating element 20 is arranged as described above, at a frequency adjustment step S600, which will be described later, the bottom surface 83 of the base substrate 80 is irradiated with the laser beam L transmitted through the adjustment vibrating arms 24a, 24b.

According to the configuration, even when the laser beam L applied to the adjustment electrode 124a (124b) is transmitted through the vibrating element 20, the active face 10a of the semiconductor substrate 10 is not irradiated with the beam. Thereby, the damage on the semiconductor substrate 10 by the laser beam L may be prevented.

The base substrate 80 of the vibrating device 1 of the embodiment is formed using a material such as ceramic as described above, and is not likely to be melted by the application of the laser beam. However, in the case where even slight melt may affect the strength of the base substrate 80, for example, a laser protective layer 86 may be provided in a region where the laser beam L is possibly applied to the base substrate 80 as shown in FIG. 2. The laser protective layer 86 may be formed using a metal layer of tungsten (W), nickel (Ni), chromium (Cr), or the like or a gold (Au)-plated metal layer or the like.

The laser protective layer 86 is provided on the bottom surface 83 of the base substrate 80, and thereby, the bottom surface 83 of the base substrate 80 is prevented from being directly irradiated with the laser beam L transmitted through the adjustment vibrating arms 24a, 24b, and the damage on the bottom surface 83 of the base substrate by the laser beam L may be prevented.

Operation of Vibrating Element

Here, an operation of the vibrating element (gyro element) 20 mounted on the vibrating device 1 will be explained. FIG. 3 shows an operation of the vibrating element 20 forming the vibrating device 1.

First, excitation drive signals are applied from the driver circuits provided on the semiconductor substrate 10 to the vibrating element 20. Under the condition that the drive vibrating arms 22a, 22b to which the predetermined excitation drive signals are applied are vibrated, an angular velocity ω around the Z-axis is applied to the vibrating element 20, and thereby, vibrations are generated in the detection vibrating arms 23a, 23b by Coriolis force. By the vibrations of the detection vibrating arms 23a, 23b, the adjustment vibrating arms 24a, 24b are excited. Then, in the vibrating device 1, the detection electrodes (not shown in FIGS. 1A and 1B) provided on the detection vibrating arms 23a, 23b detect distortion of the quartz (piezoelectric material) as the base material of the vibrating element 20 generated by the vibrations, and thereby, the angular velocity may be obtained.

Method of Manufacturing Sensor Device

Here, a method of manufacturing the vibrating device 1 of the embodiment will be explained.

Figure 4:
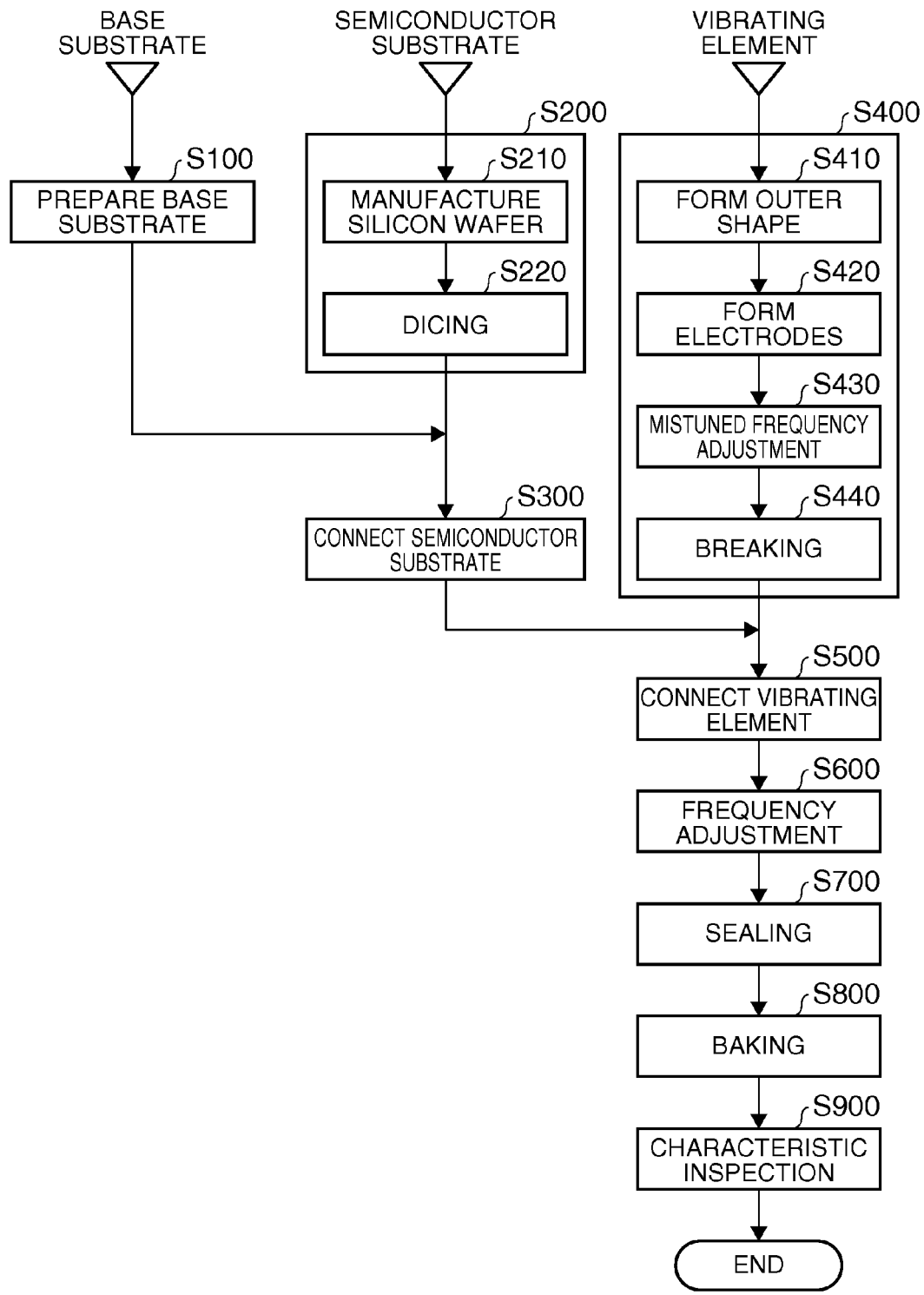
FIG. 4 is a flowchart showing a manufacturing process of a vibrating device according to the embodiment.

Note that, in the explanation, in the vibrating device 1 shown in FIGS. 1A and 1B, a method of manufacturing the vibrating device 1 in a mode of using the package having the recessed part as the base substrate 80, bonding the vibrating device 1 within the package, and sealing the device using the lid member 85 will be explained. FIG. 4 is a flowchart showing a manufacturing process of the vibrating device 1. Note that the following explanation will be made using FIG. 4, referring to FIGS. 1A and 1B, and using the signs of the drawings.

As shown in FIG. 4, the method of manufacturing the vibrating device 1 includes a base substrate preparation step S100, a semiconductor substrate formation step S200, a semiconductor substrate connection step S300, a vibrating element formation step S400, a vibrating element connection step S500, the frequency adjustment step S600, a sealing step S700, a baking step S800, and a characteristic inspection step S900.

Base Substrate Preparation Step

The base substrate preparation step S100 is a step of preparing the base substrate 80. The base substrate preparation step S100 prepares the base substrate 80 formed using ceramic or the like. Note that the connecting parts 82 for electrical connection to the semiconductor substrate 10 are formed on the bottom surface 83 as one surface of the base substrate 80.

Semiconductor Substrate Formation Step

The semiconductor substrate formation step S200 is a step of forming the semiconductor substrate 10 on which the vibrating element 20 is to be mounted. The semiconductor substrate formation step S200 includes a silicon wafer manufacturing step S210 and a dicing step S220.

The silicon wafer manufacturing step S210 forms a plurality of the semiconductor substrates 10 having active elements on a silicon wafer at a time using a semiconductor manufacturing process. At the step, the first electrodes 13, the wiring terminals 14, and the other electrodes (not shown) are formed in locations to be conducting parts of the integrated circuit on the active faces 10a of the respective semiconductor substrates 10 formed on the silicon wafer. Further, the stress relaxation layers, the first insulating films, and the protective layers (not shown) are formed at the active face 10a sides of the semiconductor substrates 10.

Then, parts of the stress relaxation layers and the first insulating films are removed by photolithography and etching for forming the opening parts. Thereby, the first electrodes 13, the other electrodes (not shown), and the wiring terminals 14 are exposed within the opening parts.

The wiring terminals 14 are nickel (Ni)- and gold (Au)-plated on their surfaces, and thereby, the bonding strength at wire bonding is improved. Note that surface treatment such as solder plating or solder precoat may be performed thereon.

Further, the silicon wafer manufacturing step S210 forms the connecting terminals 12 formed by Au stud bump on the first electrodes 13. Note that the connecting terminals 12 may be formed using another conducting material such as copper, aluminum (Al), solder ball, or solder paste than the Au stud bump.

Furthermore, at the silicon wafer manufacturing step S210, the element holding parts 15 may be formed at the active face 10a sides. The element holding parts 15 are formed using a polyimide resin, a silicone resin, a urethane resin, or the like.

The dicing step S220 is a step of separating the semiconductor substrates 10 formed in multiple pieces on the silicon wafer. The dicing step S220 first performs cutting of the protective layers and half-cutting of the semiconductor substrates 10 by bevel cutting. Then, the step performs cutting of the semiconductor substrates 10 using a dicing saw with its rotary blade.

In the bevel cutting of cutting (cutting out) the protective layers, a V-shaped blade is pressed against the protective layers and the semiconductor substrates 10 as objects to be cut, and thereby, the protective layers and the semiconductor substrates 10 are cut out in the same V-shapes as that of the blade.

Then, the dicing step S220 cuts the silicon wafer by inserting the rotary blade into the parts in which the protective layers and parts of the semiconductor substrates 10 are cut out by bevel cutting and the semiconductor substrates 10 appear, and thereby, the semiconductor substrates 10 are separated.

Semiconductor Substrate Connection Step

The semiconductor substrate connection step S300 is a step of bonding the passive face 10b side of the semiconductor substrate 10 to the bottom surface 83 of the base substrate 80 via the bonding member (not shown) such as an adhesive. Further, the semiconductor substrate connection step S300 connects the wiring terminals 14 of the semiconductor substrate 10 and the connecting parts 82 of the base substrate 80 by wire bonding using the wires 31.

Vibrating Element Formation Step

The vibrating element formation step S400 is a step of forming the vibrating element 20 as the vibrating element. The vibrating element formation step S400 includes an outer shape forming step S410, an electrode forming step S420, a mistuned frequency adjusting step S430, and a breaking step S440.

The vibrating element 20 may be formed using a vibrating element wafer (not shown) into multiple pieces.

First, the outer shape forming step S410 is a step of forming outer shapes of a plurality of the vibrating elements 20 by etching using the photolithography technology on the vibrating element wafer.

Then, the electrode forming step S420 is a step of forming metal layers formed by sputtering or evaporation on a raw material of the vibrating elements 20 as electrodes of drive electrodes, detection electrodes, etc. and wiring using the photolithography technology. At the electrode forming step S420, the adjustment electrodes 124a, 124b as the mass adjustment parts are formed on the adjustment vibrating arms 24a, 24b, the detection electrodes (not shown) are formed on the detection vibrating arms 23a, 23b, and the drive electrodes (not shown) are formed on the drive vibrating arms 22a, 22b in the vibrating elements 20.

Mistuned Frequency Adjusting Step

The mistuned frequency adjusting step S430 is a step of performing mistuned frequency adjustment of the vibrating elements 20 using a laser beam.

At the mistuned frequency adjusting step S430, balance adjustment (tuning) of detecting a difference in flexural vibration frequency between the adjustment vibrating arms 24a, 24b and the drive vibrating arms 22a, 22b and correcting the difference is performed, and the adjustment may be performed in the state of the vibrating element wafer. In other words, the step may be performed before the braking step S440 to be described later.

The tuning is performed by applying a focused laser beam to the adjustment electrodes 124a, 124b provided on the adjustment vibrating arms 24a, 24b. Parts of the adjustment electrodes 124a, 124b irradiated with the laser beam are melted and vaporized by the energy of the laser beam. By the melting and vaporization of the adjustment electrodes 124a, 124b, the masses of the adjustment vibrating arms 24a, 24b change. Accordingly, the resonance frequencies of the drive vibrating arms 22a, 22b and the adjustment vibrating arms 24a, 24b change, and thereby, balance adjustment (tuning) of the respective vibrating arms may be performed. The tuning is performed again at the frequency adjustment step S600 after the vibrating element 20 is mounted on the semiconductor substrate 10.

Vibrating Element Breaking Step

The breaking step S440 is a step of separating individual pieces of vibrating elements 20 by breaking (cutting) the vibrating element wafer. The separation into individual pieces may be performed, after perforations or grooves are formed in the connecting parts of parts of the outer shapes of the vibrating elements 20 on the vibrating element wafer at the outer shape forming step S410, by breaking the wafer along the perforations or the grooves.

Vibrating Element Connection Step

The vibrating element connection step S500 is a step of mounting the vibrating element 20 on the semiconductor substrate 10 and connecting the first electrodes 13 of the semiconductor substrate 10 to the electrodes (not shown) provided on the supporting part 27 of the vibrating element 20 via the connecting terminals 12.

In this regard, the vibrating element 20 is provided so that the adjustment electrodes 124a, 124b as the mass adjustment parts provided on the adjustment vibrating arms 24a, 24b may not overlap with the semiconductor substrate 10 in the plan view of the vibrating device 1. In other words, the vibrating element 20 is provided so that the adjustment electrodes 124a, 124b may face the bottom surface 83 of the base substrate 80 in the plan view of the vibrating device 1, and the vibrating element 20 is mounted on the semiconductor substrate 10.

Frequency Adjustment Step

The frequency adjustment step S600 is a step of performing frequency adjustment (balance tuning) of the vibrating element 20 using a laser beam. The balance tuning is performed by applying a focused laser beam to the adjustment electrodes 124a, 124b provided on the adjustment vibrating arms 24a, 24b in the same manner as the above described mistuned frequency adjusting step S430. The adjustment electrodes 124a, 124b irradiated with the laser beam are melted and vaporized by the energy of the laser beam, the resonance frequencies of the adjustment vibrating arms 24a, 24b are changed due to their mass changes, and thereby, the balance adjustment (tuning) of the drive vibrating arms 22a, 22b may be performed. Specifically, when the drive vibrating arms 22a, 22b are excited and vibrated under the condition that no angular velocity is applied to the vibrating device 1 (vibrating element 20), the frequency adjustment is performed by the mass adjustment of the adjustment electrodes 124a, 124b as the mass adjustment parts provided on the adjustment vibrating arms 24a, 24b so that the detection vibrating arms 23a, 23b may not vibrate.

Concurrently, the laser beam that has melted and evaporated the adjustment electrodes 124a, 124b can be transmitted through the vibrating element 20, however, in the configuration of the example, the adjustment electrodes 124a, 124b as the mass adjustment parts provided on the adjustment vibrating arms 24a, 24b are placed not to overlap with the semiconductor substrate 10 in the plan view of the vibrating device 1. Accordingly, when the laser beam is transmitted through the adjustment vibrating arms 24a, 24b (vibrating element 20), the laser beam is applied to the bottom surface 83 of the base substrate 80 or the laser protective layer 86 provided on the bottom surface 83 of the base substrate 80, but not directly applied to the semiconductor substrate 10. Thereby, melting and characteristic loss of the integrated circuit including the active elements, wiring, etc. provided on the semiconductor substrate 10 may be avoided.

Sealing Step

The sealing step S700 is a step of sealing the recessed part of the base substrate 80 to which the semiconductor substrate 10 and the vibrating element 20 have been bonded by bonding the lid member 85 on the base substrate (package) 80. In this example, the metal lid 85 is used as the lid member. At the sealing step S700, the lid 85 may be bonded by seam welding via the seal ring 84 of an iron (Fe)-nickel (Ni) alloy or the like, for example. In this regard, according to need, the cavity formed by the recessed part of the base substrate 80 and the lid 85 may be depressurized or filled with an inert gas atmosphere for closing and sealing. Further, as another bonding method of the lid 85, the lid 85 may be bonded onto the base substrate 80 via a metal brazing filler such as solder, or a glass lid 85 may be used and bonded onto the base substrate 80 with low-melting-point glass or the like.

Baking Step, Characteristic Inspection Step

The baking step S800 is a step of putting the vibrating device 1 into an oven at a predetermined temperature in a predetermined time and performing baking of exhausting the liquid contained in the vibrating device 1.

Further, the characteristic inspection step S900 is a step of removing non-standard defective products by performing characteristic inspections such as electrical characteristic inspections and appearance inspections.

If the characteristic inspection step S900 is completed, a series of manufacturing steps of the vibrating device 1 end.

According to the vibrating device 1 of the above described embodiment, the following advantage may be obtained.

The adjustment electrodes 124a, 124b as the mass adjustment parts provided on the adjustment vibrating arms 24a, 24b of the vibrating device 1 are placed to face the bottom surface 83 of the base substrate 80, but not to overlap with the semiconductor substrate 10. Therefore, at the frequency adjustment step S600, the laser beam L transmitted through the adjustment vibrating arms 24a, 24b is applied to the bottom surface 83 of the base substrate 80, but not applied to the active face 10a of the semiconductor substrate 10. Thereby, the damage on the semiconductor substrate 10 by the laser beam L may be prevented.

Further, according to the above described method of manufacturing the vibrating device 1, the following advantage may be obtained.

The method of manufacturing the vibrating device 1 places the adjustment electrodes 124a, 124b in locations not overlapping with the active face 10a of the semiconductor substrate 10 in the plan view of the vibrating device 1, and mounts the vibrating element 20 on the semiconductor substrate 10. Then, the mass adjustment is performed by applying the laser beam to the adjustment electrodes 124a, 124b. Therefore, even when the laser beam that has applied to the adjustment electrodes 124a, 124b is transmitted through the vibrating element 20, the beam is not applied to the semiconductor substrate 10. As described above, the method of manufacturing the vibrating device 1 that may prevent the damage on the semiconductor substrate 10 by the laser beam may be provided.

In the above described embodiment, the gyro sensor using the so-called H-shaped gyro element as the element has been explained as an example, however, the electronic device is not limited to that. As other electronic devices, for example, a gyro sensor using a WT-shaped or tuning-fork gyro element as the element, a timing device (a quartz vibrator, a quartz oscillator, or the like) using a quartz vibrating element (vibrating reed), a pressure sensor using a pressure-sensitive element, etc. may be employed.

Electronic Apparatus

Next, an electronic apparatus to which the electronic device according to one embodiment of the invention will be explained in detail with reference to FIGS. 5 to 7.

Figure 5:
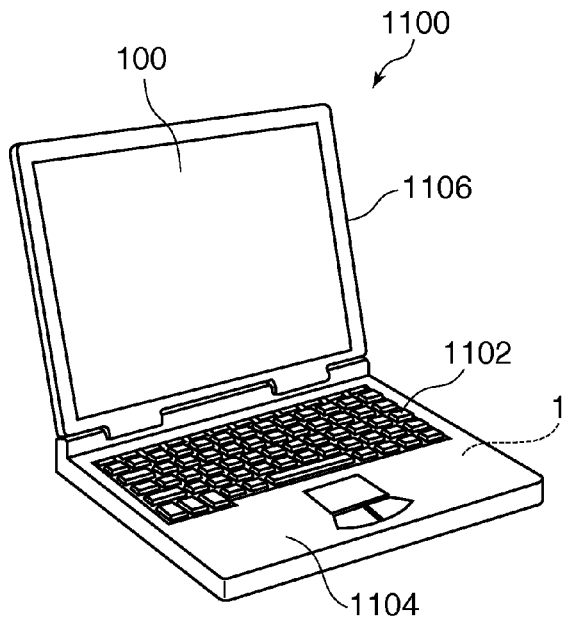
FIG. 5 is a perspective view showing a configuration of a mobile personal computer as an example of an electronic apparatus.

FIG. 5 is a perspective view showing a schematic configuration of a mobile (or notebook) personal computer as the electronic apparatus including the vibrating element according to the one embodiment of the invention. In the drawing, a personal computer 1100 includes a main body unit 1104 having a keyboard 1102 and a display unit 1106 having a display part 100, and the display unit 1106 is rotatably supported via a hinge structure part with respect to the main body unit 1104. The personal computer 1100 contains the electronic device (timing device) 1 that functions as a filter, a resonator, a reference clock, or the like.

Figure 6:
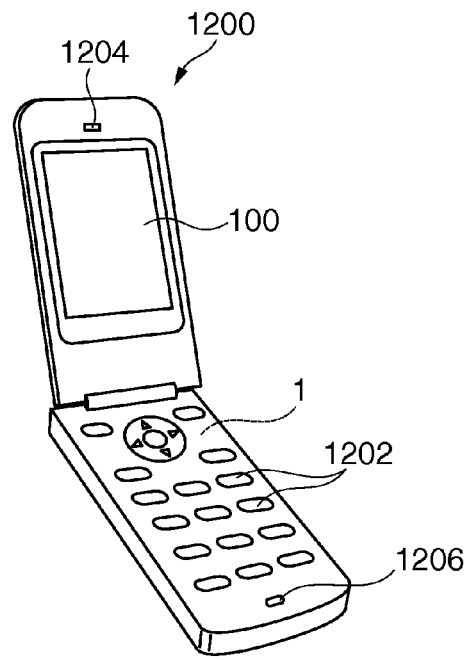
FIG. 6 is a perspective view showing a configuration of a cellular phone as an example of the electronic apparatus.

FIG. 6 is a perspective view showing a schematic configuration of a cellular phone (including a PHS) as the electronic apparatus including the electronic device according to the one embodiment of the invention. In the drawing, a cellular phone 1200 includes a plurality of operation buttons 1202, an ear piece 1204, and a mouthpiece 1206, and a display part 100 is provided between the operation buttons 1202 and the ear piece 1204. The cellular phone 1200 contains the electronic device (timing device, gyro sensor) 1 that functions as a filter, a resonator, an angular velocity sensor, or the like.

Figure 7:
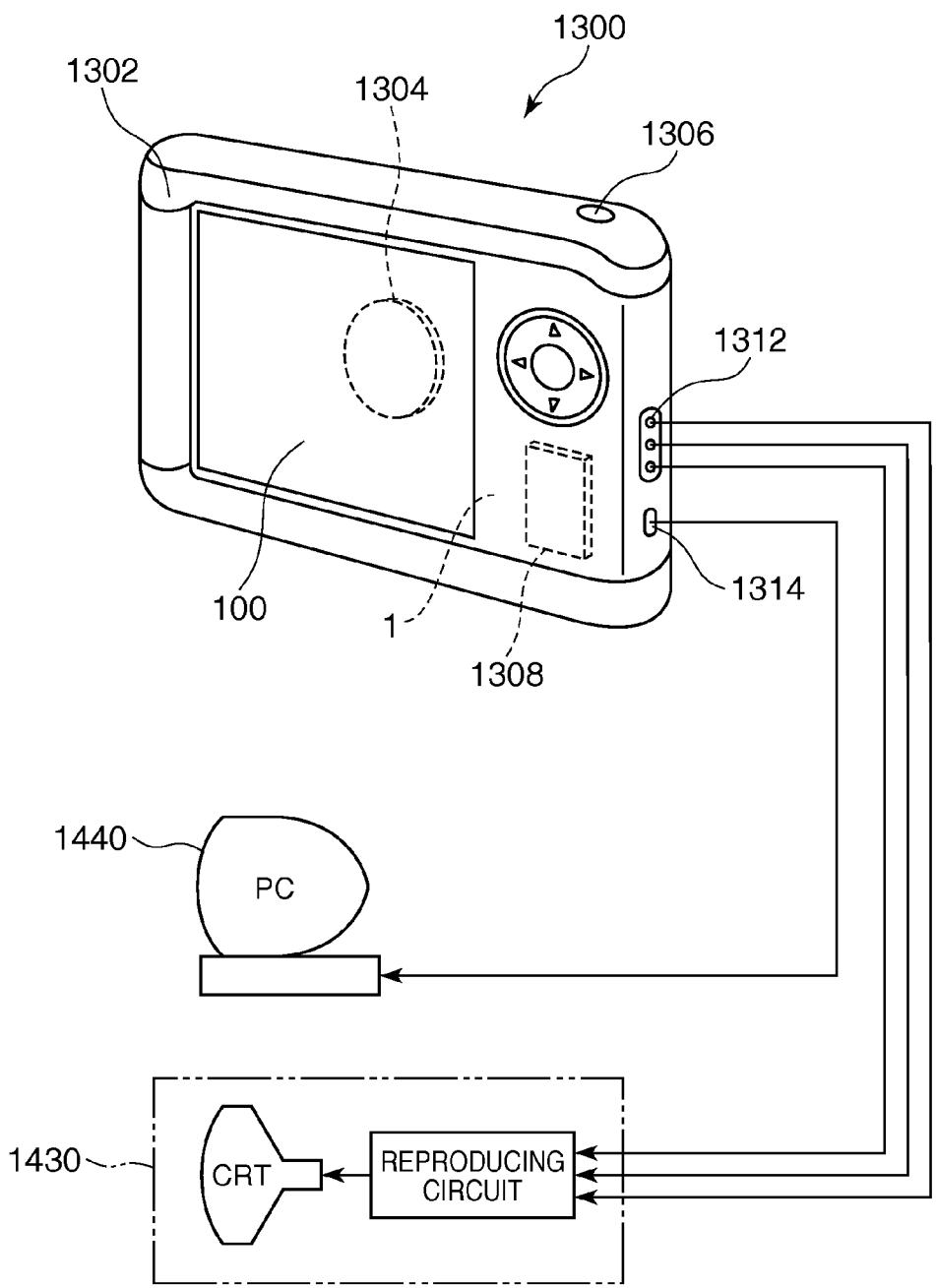
FIG. 7 is a perspective view showing a configuration of a digital still camera as an example of the electronic apparatus.

FIG. 7 is a perspective view showing a schematic configuration of a digital still camera as the electronic apparatus including the vibrating element according to the one embodiment of the invention. Note that, in the drawing, connection to an external device is simply shown. Here, in a typical camera, a silver halide photographic film is exposed to light by an optical image of a subject and, on the other hand, a digital still camera 1300 photoelectrically converts an optical image of a subject using an image sensing device such as a CCD (Charge Coupled Device) and generates imaging signals (image signals).

On a back surface of a case (body) 1302 in the digital still camera 1300, a display part 100 is provided and adapted to display based on the imaging signals by the CCD, and the display part 100 functions as a finder that displays the subject as an electronic image. Further, on the front side (the rear side in the drawing) of the case 1302, a light receiving unit 1304 including an optical lens (imaging system), the CCD, etc. is provided.

When a photographer checks the subject image displayed on the display part 100 and presses down a shutter button 1306, the imaging signals of the CCD at the time are transferred and stored into a memory 1308. Further, in the digital still camera 1300, a video signal output terminal 1312 and an input/output terminal for data communication 1314 are provided on the side surface of the case 1302. Furthermore, as shown in the drawing, a television monitor 1430 is connected to the video signal output terminal 1312 and a personal computer 1440 is connected to the input/output terminal for data communication 1314, respectively, according to need. In addition, by predetermined operation, the imaging signals stored in the memory 1308 are output to the television monitor 1430 and the personal computer 1440. The digital still camera 1300 contains the electronic device (timing device, gyro sensor) 1 that functions as a filter, a resonator, an angular velocity sensor, or the like.

Note that the vibrating device 1 according to the one embodiment of the invention may be applied not only to the personal computer (mobile personal computer) in FIG. 5, the cellular phone in FIG. 6, and the digital still camera in FIG. 7 but also to an electronic apparatus such as an inkjet ejection device (for example, an inkjet printer), a laptop personal computer, a television, a video camera, a video tape recorder, a car navigation system, a pager, a personal digital assistance (with or without communication function), an electronic dictionary, a calculator, an electronic game machine, a word processor, a work station, a videophone, a security television monitor, electronic binoculars, a POS terminal, a medical device (for example, an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), or a flight simulator.

Mobile Unit

Figure 8:
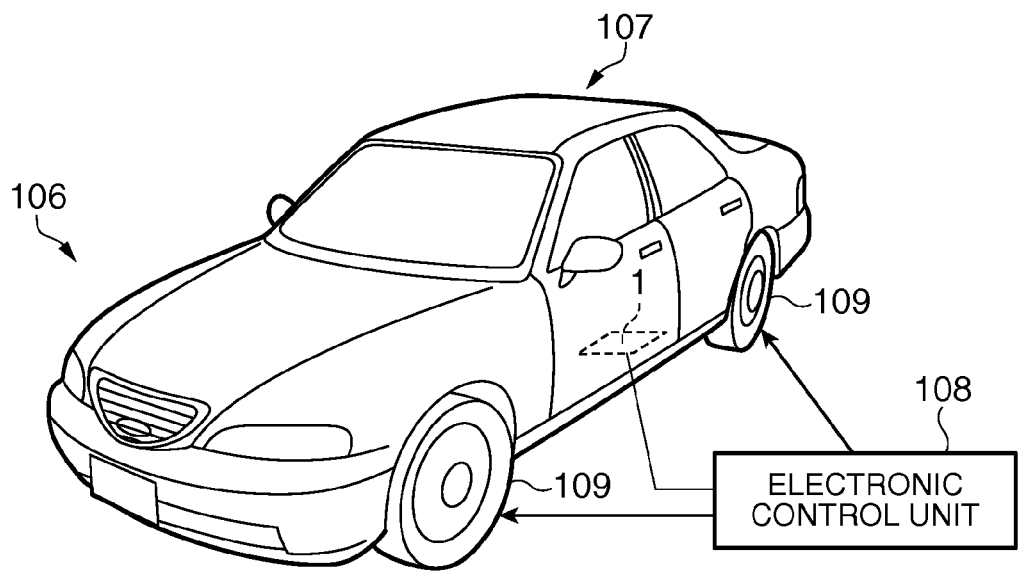
FIG. 8 is a perspective view showing a configuration of an automobile as an example of a mobile unit.

FIG. 8 is a perspective view schematically showing an automobile as an example of a mobile unit. On an automobile 106, the vibrating device 1 such as a vibrator having the vibrating element or a gyro sensor having a gyro element according to the embodiment of the invention is mounted. For example, as shown in the same drawing, in the automobile 106 as the mobile unit, an electronic control unit 108 that contains the vibrating device 1 and controls tires 109 is mounted on a vehicle body 107. Further, the vibrating device 1 may be widely applied to another electronic control unit (ECU) such as a keyless entry system, an immobilizer, a car navigation system, a car air-conditioner, an antilock brake system (ABS), an airbag, a tire pressure monitoring system (TPMS), an engine control, a battery monitor for hybrid cars and electric cars, or a vehicle attitude control system.

The entire disclosure of Japanese Patent Application No. 2012-130480, filed Jun. 8, 2012 is expressly incorporated by reference herein.

What is claimed is:

1. An electronic device comprising:
   a substrate;
   an element above which a mass adjustment part is provided, the element being provided above the substrate;
   a circuit element above which the element is mounted, the circuit element being provided on the substrate; and
   a protective layer that is provided on the substrate below the mass adjustment part, the protective layer protecting a surface of the substrate from a laser beam, wherein
   the mass adjustment part is provided in a location so as not to overlap with the circuit element in a plan view.

2. The electronic device according to claim 1, wherein the mass adjustment part has a metal layer and at least a part of the metal layer is removed.

3. The electronic device according to claim 1, wherein the element includes:
   a base part;
   a supporting part extending from the base part;
   a pair of detection vibrating arms extending from one end of the base part;
   a pair of drive vibrating arms extending from the other end opposite to the one end of the base part; and
   a pair of adjustment vibrating arms extending from one of the one end and the other end and provided to sandwich the detection vibrating arms or the drive vibrating arms,
   wherein the mass adjustment part is provided on the adjustment vibrating arm, and
   the supporting part and the circuit element are connected.

4. The electronic device according to claim 2, wherein the element includes:
   a base part;
   a supporting part extending from the base part;
   a pair of detection vibrating arms extending from one end of the base part;
   a pair of drive vibrating arms extending from the other end opposite to the one end of the base part; and
   a pair of adjustment vibrating arms extending from one of the one end and the other end and provided to sandwich the detection vibrating arms or the drive vibrating arms,
   wherein the mass adjustment part is provided above the adjustment vibrating arm, and
   the supporting part and the circuit element are connected.

5. An electronic apparatus comprising the electronic device according to claim 1.

6. An electronic apparatus comprising the electronic device according to claim 2.

7. An electronic apparatus comprising the electronic device according to claim 3.

8. An electronic apparatus comprising the electronic device according to claim 4.

9. A mobile unit comprising the electronic device according to claim 1.

10. A mobile unit comprising the electronic device according to claim 2.

11. A mobile unit comprising the electronic device according to claim 3.

12. A mobile unit comprising the electronic device according to claim 4.

13. A method of manufacturing an electronic device comprising:
   preparing a substrate;
   preparing an element on which a mass adjustment part is provided, the element being provided above the substrate;
   preparing a circuit element on which the element is to be mounted, the circuit element being provided on the substrate;
   preparing a protective layer on the substrate below the mass adjustment part, the protective layer protecting a surface of the substrate from a laser beam;
   placing the mass adjustment part in a location not overlapping with the circuit element in a plan view and mounting the element on the circuit element; and
   performing mass adjustment by applying the laser beam to the mass adjustment part from above.

* * * * *